United States Patent [19]
Gomez

[11] Patent Number: 6,109,337
[45] Date of Patent: *Aug. 29, 2000

[54] APPARATUS FOR CONTROLLING TEMPERATURE

[75] Inventor: Enrique Llorente Gomez, Madrid, Spain

[73] Assignee: Actionenergy Limited, London, United Kingdom

[ * ] Notice: This patent issued on a continued prosecution application filed under 37 CFR 1.53(d), and is subject to the twenty year patent term provisions of 35 U.S.C. 154(a)(2).

[21] Appl. No.: 08/564,171

[22] PCT Filed: Jun. 2, 1994

[86] PCT No.: PCT/GB94/01202

§ 371 Date: Dec. 4, 1995

§ 102(e) Date: Dec. 4, 1995

[87] PCT Pub. No.: WO94/28698

PCT Pub. Date: Dec. 8, 1994

[30] Foreign Application Priority Data

Jun. 2, 1993 [GB] United Kingdom .................... 9311404

[51] Int. Cl.[7] ..................................................... F28D 17/00
[52] U.S. Cl. ................. 165/10; 165/104.33; 165/104.34; 165/272; 165/279; 361/724; 361/700
[58] Field of Search .......................... 165/104.14, 104.33, 165/272, 279, 10, 104.34; 361/700, 724; 174/15.2

[56] References Cited

U.S. PATENT DOCUMENTS

| | | |
|---|---|---|
| 1,834,873 | 12/1931 | Rowledge . |
| 2,365,497 | 12/1944 | Smith ....................... 165/279 |
| 2,499,736 | 3/1950 | Kleen ........................ 62/156 |
| 3,226,602 | 12/1965 | Elfving ..................... 361/700 |
| 3,818,983 | 6/1974 | Grandia .................... 361/700 |
| 3,850,006 | 11/1974 | Redfern et al. ............... 62/216 |
| 3,985,182 | 10/1976 | Hara et al. ................ 165/272 |
| 4,222,436 | 9/1980 | Pravda . |
| 4,293,030 | 10/1981 | Rambach ............... 165/104.33 X |
| 4,306,613 | 12/1981 | Christopher ........... 165/104.14 X |
| 4,337,825 | 7/1982 | Stewart .................. 165/104.14 X |
| 4,830,092 | 5/1989 | Lee ....................... 165/10 X |
| 4,842,053 | 6/1989 | Yatsuhashi et al. ........... 165/104.14 |
| 4,909,316 | 3/1990 | Kamei et al. ............... 165/104.26 |
| 4,921,039 | 5/1990 | Ghiraldi ................ 165/104.33 X |
| 4,921,043 | 5/1990 | Ghiraldi . |
| 4,971,139 | 11/1990 | Khattar .................. 165/104.14 X |
| 4,997,034 | 3/1991 | Steffen et al. .............. 165/104.34 |
| 5,220,954 | 6/1993 | Longardner et al. ............ 165/10 |

FOREIGN PATENT DOCUMENTS

| | | |
|---|---|---|
| 413 322 | 5/1971 | Australia . |
| 0413322 | 10/1967 | Austria . |
| 0201652 | 11/1986 | European Pat. Off. .......... 165/104.14 |
| 0429188 | 5/1991 | European Pat. Off. ............... 361/700 |
| 2712017 | 9/1978 | Germany ................... 165/104.14 |
| 0037938 | 4/1978 | Japan ........................... 361/700 |
| 0111551 | 9/1978 | Japan ....................... 165/104.14 |
| 403093295 | 4/1991 | Japan ........................... 361/700 |
| 04 163 298 | 6/1992 | Japan . |
| 404320399 | 11/1992 | Japan ........................... 361/700 |
| 2 040 033 | 8/1980 | United Kingdom . |
| 2040033 | 8/1990 | United Kingdom . |

Primary Examiner—Christopher Atkinson
Attorney, Agent, or Firm—McDermott, Will & Emery

[57] ABSTRACT

Apparatus for controlling temperature within a housing (200) comprises a thermal storage device (102) for maintaining a controlled temperature within the housing, and a thermal transfer arrangement (104) for selectively transferring heat between the thermal storage device and the external environment so as to effect thermal storage in the storage device, the thermal storage device comprising a thermal storage medium which is in direct contact with the thermal transfer arrangement. A further aspect of the invention is disclosed, in which a plurality of thermal storage devices are provided, each one being separate from the other such devices.

13 Claims, 4 Drawing Sheets

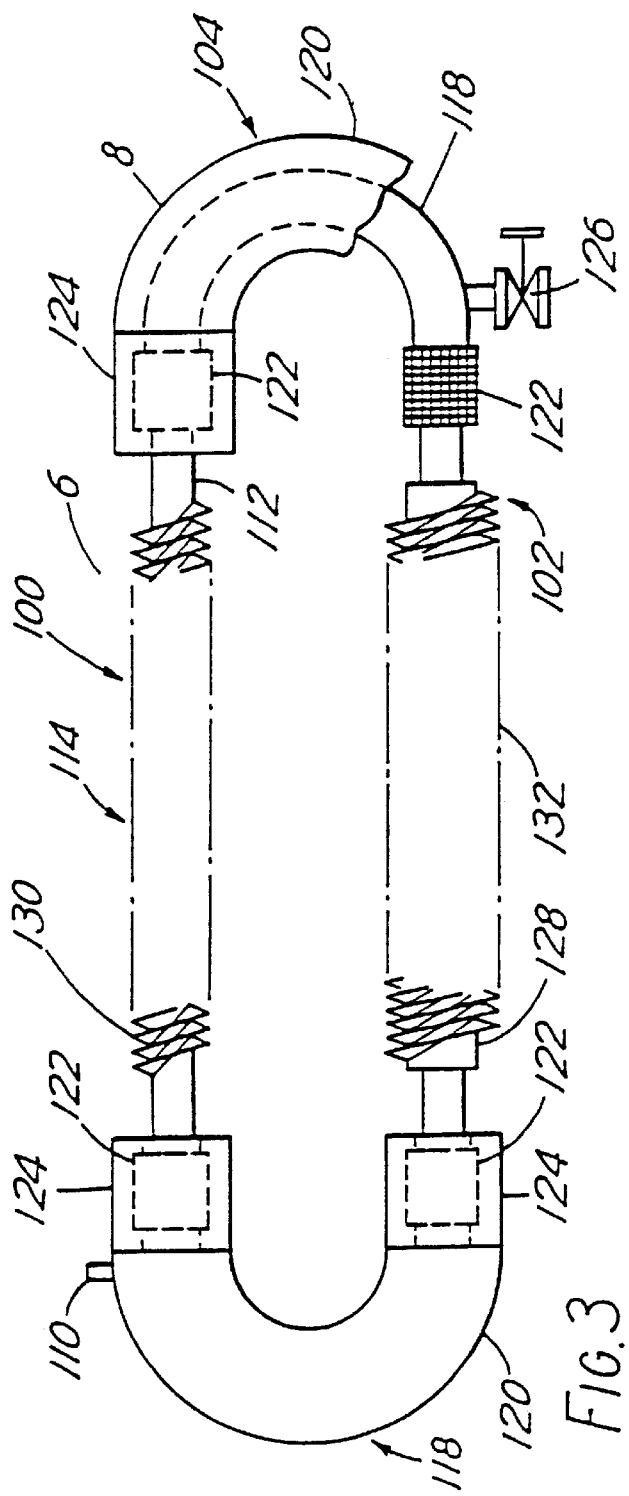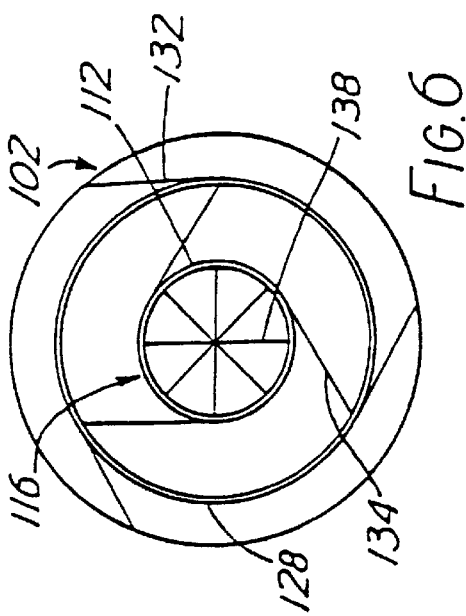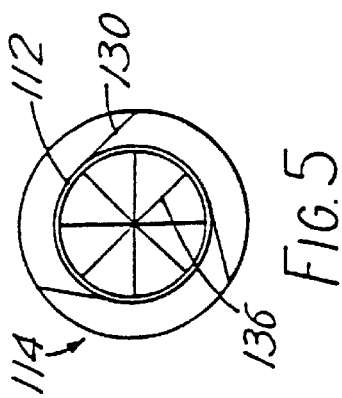
Fig.3
Fig.6
Fig.5

APPARATUS FOR CONTROLLING TEMPERATURE

This invention relates to apparatus for controlling temperature within a housing, and particularly to apparatus for the passive cooling of equipment accommodated in such a housing. The invention also relates to a housing incorporating the apparatus.

In many technical areas such as telecommunications, fibre optic systems, meteorology, transmission and-data control, it is necessary to keep electric or electronic equipment at remote locations. A desert environment is one typical location. The equipment is typically kept in a purpose-built, insulated, closed ambient housing (or shelter), often in adverse weather conditions. In order to ensure a high Mean Time Between Failure for such equipment, it is necessary to maintain the equipment at a near-constant temperature, and often between certain critical temperature limits. At these remote locations, an external power supply is usually not available, and the equipment may consequently be solar-powered via photovoltaic cells. However, the power from these cells is normally insufficient to power active cooling apparatus, such as an air conditioning system. Hence passive cooling apparatus is required in order to control the temperature of the environment in the housing.

Passive cooling apparatus is already known. It comprises essentially three main components, an insulated container (housing) to resist heat transfer from the external ambient, a thermal storage device for maintaining a controlled temperature within the housing and a thermal transfer arrangement for selectively transferring heat between the thermal storage device and the external environment so as to effect thermal storage in the storage device.

In the known apparatus the thermal storage (accumulating) device includes a thermal storage (accumulating) medium in the form of a substance which changes its phase between solid and liquid at or near the desired temperature for the environment inside the housing.

The thermal storage medium inside the thermal storage device absorbs and accumulates the heat given off from the electric/electronic equipment housed inside the container and the heat flowing through the walls during the hotter part of the day.

The thermal transfer arrangement comprises a conduit arranged in a closed circuit and containing a thermal transfer fluid. The conduit is arranged such that inside the housing the fluid exchanges heat with the thermal storage device; it also passes out of the housing, upwardly and over the housing, where it is arranged such that the fluid also exchanges heat with the external environment.

During the part of the day when the external environment is hotter than the internal environment, no heat transfer takes place because the warmer thermal transfer fluid outside is trapped in the portion of the conduit outside the housing. However, at night time or at other times when the external environment is cooler than the internal environment, the colder fluid outside falls under gravity into the portion of the conduit inside, and cools down and regenerates (liquid to solid) the thermal storage medium inside the thermal storage device. Hence, the thermal storage medium inside the thermal storage device is regenerated (liquid to solid) by selective heat transfer between the storage device and the external environment, the selectivity of the apparatus being reliant on the buoyancy force of natural convention of the thermal transfer fluid.

In the known apparatus, a number of thermal transfer arrangements are provided, each comprising a conduit in the form of a closed circuit in this known apparatus, a large number of individual thermal storage devices are provided. Each one comprises bonded sheets of metal in which are formed individual pockets containing thermal storage medium. The same number of pockets is provided as thermal transfer arrangements. The sheets of metal are sealed together around the pockets by a roll-bonding technique, in order to retain the medium. A hole is also formed through the centre of each pocket, the sheets of metal also being sealed together around the periphery of each hole. Each hole receives the conduit of its respective transfer arrangement. Heat transfer between the conduit and the individual thermal storage device is effected by ensuring a tight, friction fit between the conduit and the metal sheets of the storage device.

As mentioned earlier, a large number of individual thermal storage devices are provided. The devices are in fact mounted in parallel array along the portions of the conduits inside the housing.

The known device suffers from two main drawbacks. Firstly, heat transfer between the individual thermal storage devices and the conduits is not particularly good, and hence the efficiency of the apparatus is significantly lower than its theoretical maximum. Secondly, the apparatus lacks versatility, in that, once constructed, the number of circuits cannot easily be added to, the number being fixed by the number of holes in the individual storage devices. The number of circuits might need to be increased if, for example, the housed electrical or electronic equipment were to be upgraded, since upgrading might mean higher heat dissipation from the equipment.

The present invention seeks to solve these or other problems. According to a first aspect of the present invention, there is provided apparatus for controlling temperature within a housing, comprising a thermal storage device for maintaining a controlled temperature within the housing, and a thermal transfer arrangement for selectively transferring heat between the thermal storage device and the external environment so as to effect thermal storage in the storage device, the thermal storage device comprising a thermal storage medium which is in direct contact with the thermal transfer arrangement.

Since the thermal storage medium (thermal accumulator) is in direct contact with the thermal transfer arrangement, it has been found that significantly improved thermal transfer can be achieved than was possible with the known apparatus. In the known apparatus, thermal transfer between the thermal storage medium and the conduit of the thermal transfer arrangement occurs via the metal sheets containing the medium, by means of a frictional fit between these sheets and the conduit. It has now been found that this frictional fit may in many circumstances prevent satisfactory heat transfer between the two components.

With the present invention, the ability to achieve better thermal transfer between the thermal storage device and the thermal transfer arrangement has the further advantage that the size of the thermal storage device can be reduced due to the higher thermal efficiency of the apparatus.

Suitably, the thermal transfer arrangement includes a conduit for transporting thermal transfer fluid, the thermal storage medium being in direct contact with the conduit. If so, preferably the thermal storage medium completely surrounds the conduit, so that thermal transfer between the two can be optimized. More preferably, the thermal transfer medium is contained within a sleeve which encloses a portion of the conduit. This has been found to be an effective way of putting the invention into practice.

Preferably, the apparatus further includes at least one fin extending through the thermal storage medium towards the thermal transfer arrangement. This can ensure a good thermal transfer with the thermal transfer arrangement. It can also assist in providing a uniform temperature distribution within the thermal storage medium For the same reasons, preferably the apparatus includes at least one fin extending between the sleeve and the conduit through the medium.

The thermal storage device may have at least one outwardly projecting fin for transferring heat with the interior of the housing. This feature can enhance the thermal transfer between the thermal storage device and the interior environment.

According to a second aspect of the present invention, there is provided apparatus for controlling temperature within a housing, comprising a plurality of thermal storage devices for maintaining a controlled temperature within the housing, and a respective thermal transfer arrangement for each such thermal storage device, for selectively transferring heat between the thermal storage device and the external environment so as to effect thermal storage in the storage device, each such thermal storage device being separate from the other such devices.

By arranging for each such thermal storage device to be separate from the other such devices, effectively a plurality of distinct individual apparatuses for controlling the temperature inside the housing can be provided. This has the advantage of greater versatility, since an individual such apparatus can be added to or subtracted from the overall temperature control apparatus relatively easily, in situ, in order to upgrade or downgrade the apparatus. Also, an individual such apparatus can be replaced relatively easily if it becomes defective, without disturbing the other such apparatuses and without involving stoppage of the remainder of the apparatus. This factor is extremely important, as it can avoid high temperatures damaging the sensitive and strategic electric or electronic equipment housed inside the shelter. Malfunction may occur, for example, due to poor transportation of the apparatus, incorrect installation or acts of-vandalism or terrorism.

Thus the apparatus can be flexible and modular, and be easily designed according to the requirements of a specific location. It can be sufficiently flexible to equip existing housings.

For ease of maintenance, preferably each thermal storage device consists of a single container containing thermal storage medium. In the preferred embodiment, each thermal storage device comprises a respective sleeve containing thermal storage medium and enclosing a portion of the thermal transfer arrangement.

Again, for ease of maintenance, each thermal transfer arrangement is separate from, or releasably connected to, the other such arrangements. Hence the entire individual temperature control apparatus is easily separable from the other such apparatuses.

Again for ease of maintenance, preferably the thermal transfer arrangement includes at least one portion which is releasably connectable with the remainder of the arrangement. For instance, one or more portions of the conduit external to the housing may be releasably connectable, to enable easy maintenance or replacement of these portions. In particular, the external heat exchanger portion may be so connectable.

The invention extends to a housing incorporating apparatus as aforesaid.

Preferred features of the invention are now described, by way of example, with reference to the accompanying drawings, in which:

FIG. 3 is a side elevational view of the apparatus shown at a somewhat enlarged scale;

FIG. 5 shows to an enlarged scale a cross-section through an external portion of the apparatus shown in FIG. 4; and FIG. 6 shows to an enlarged scale a cross-section through an internal portion of the apparatus shown in FIG. 4.

Figure 1:
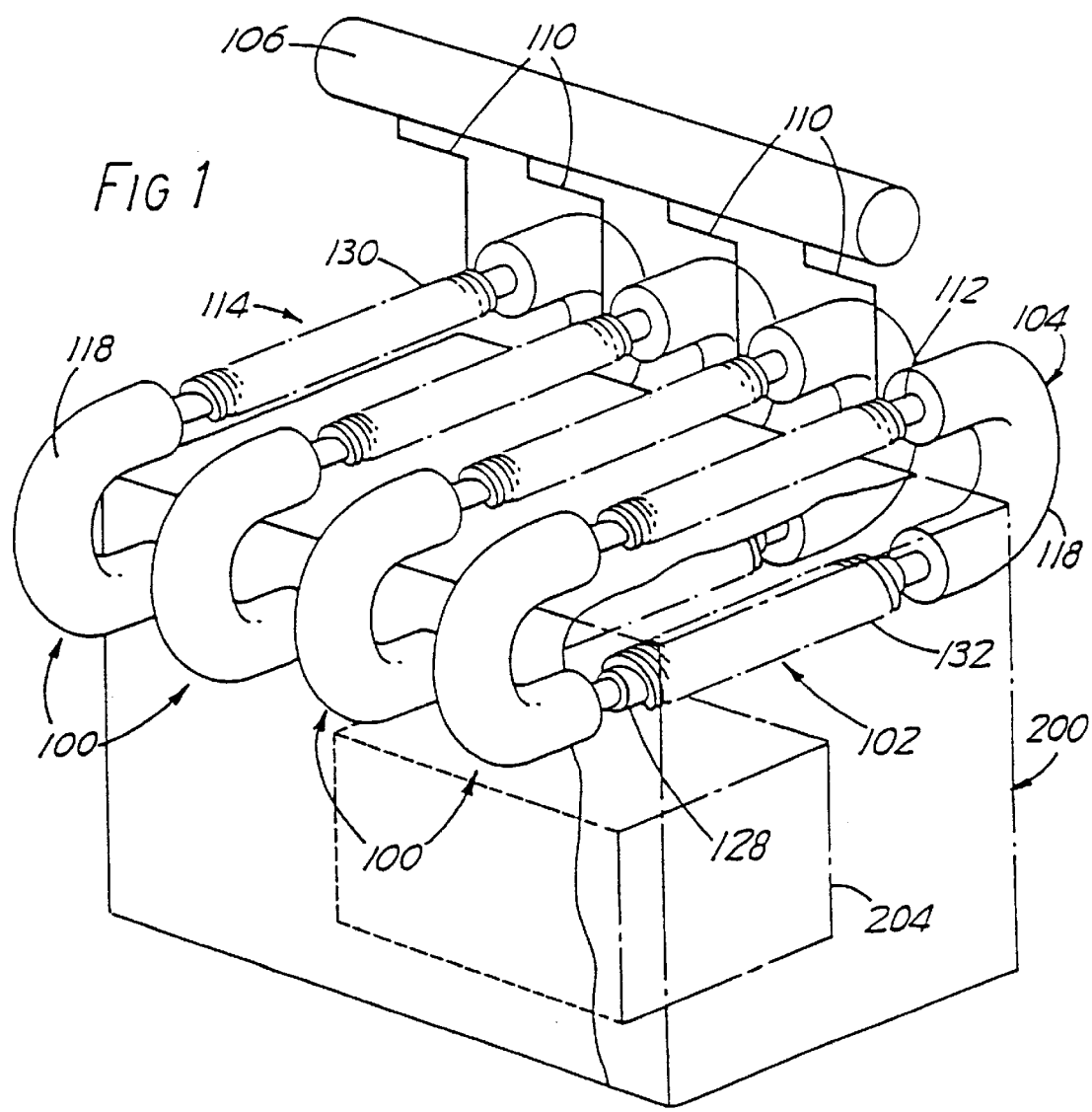
FIG. 1 is a schematic perspective view of apparatus according to the present invention for controlling temperature within a housing.
Figure 2:
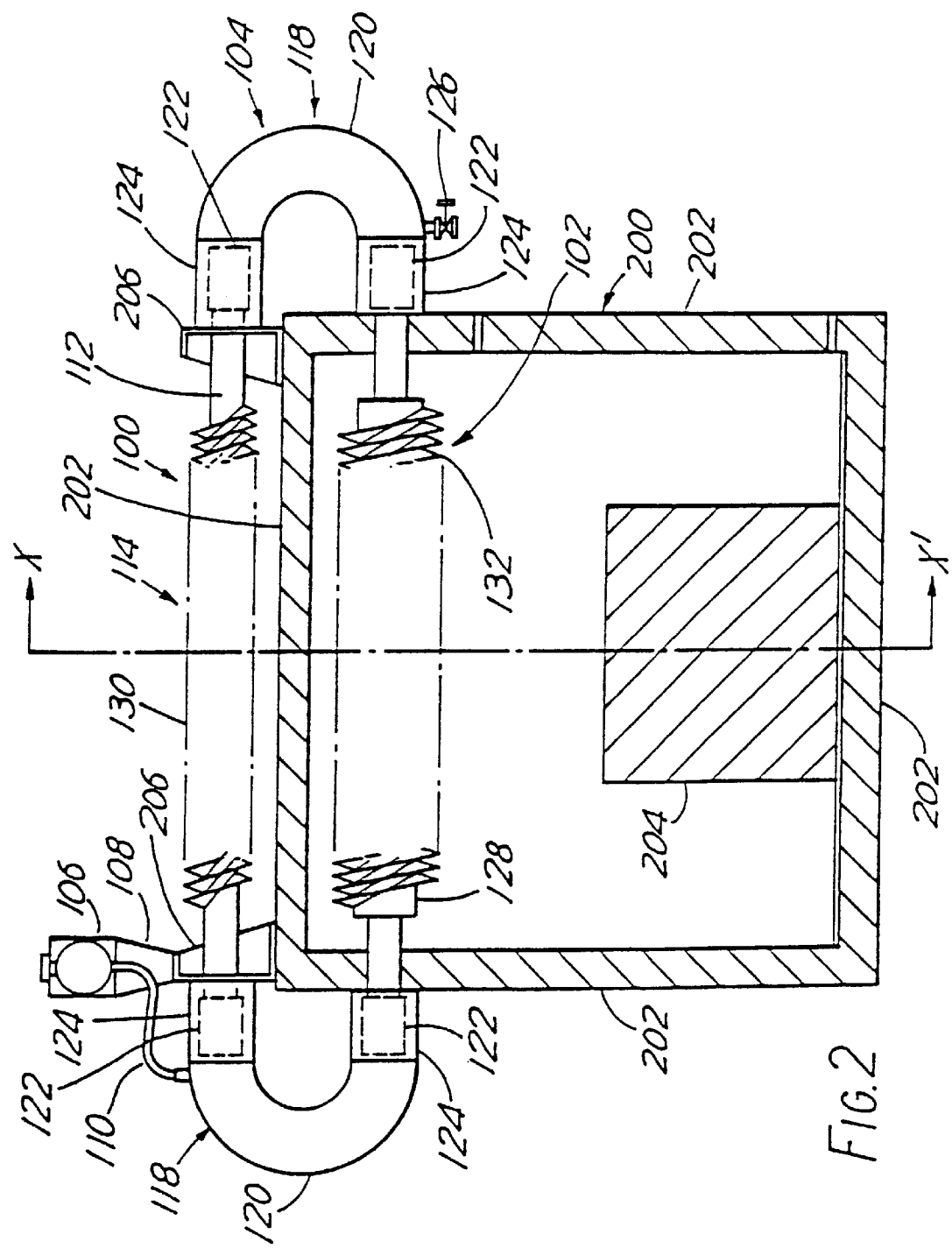
FIG. 2 is a side elevational view of the apparatus shown incorporated into a housing, the housing being shown in section.
Figure 4:
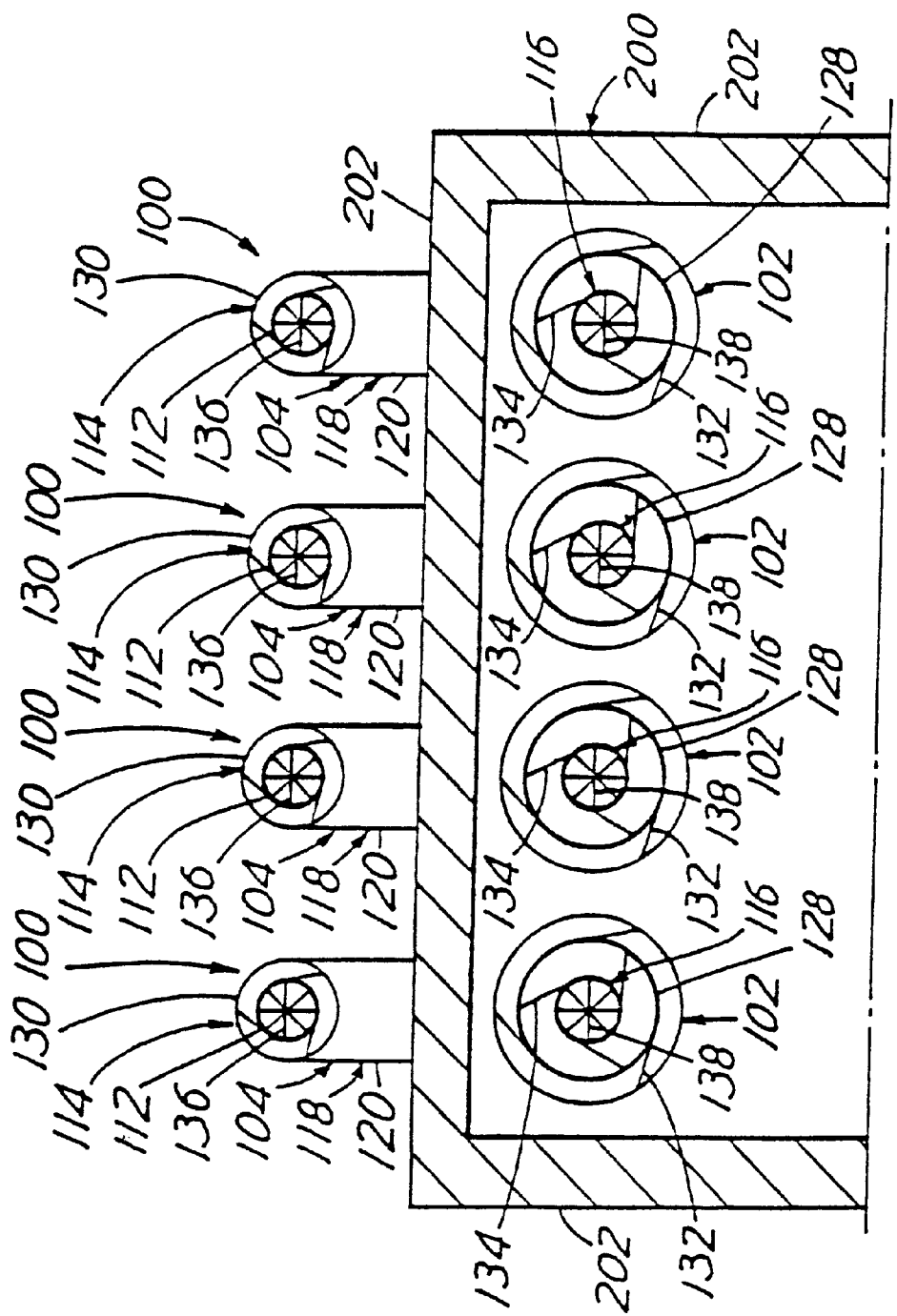
FIG. 4 is a cross-sectional view of the apparatus incorporated into the housing, the cross-section being taken along the line XX' shown in FIG. 2, only part of the housing being shown.

Referring first to FIGS. 1 and 2, apparatus for controlling temperature within a housing comprises generally four individual such apparatuses, each designated as 100. It will be understood that the number of individual apparatuses provided is not critical, and is dependent mainly on the thermal performance necessary for thermal temperature control of the housing and also on the housing location itself. Each individual such apparatus includes a thermal storage device 102 and a thermal transfer arrangement 104 which carries thermal transfer fluid (not shown). In this embodiment, the thermal transfer fluid is an aqueous solution of 1,2-diols (dihydroxyl alcohols). An expansion tank 106, in this embodiment of circular cross-section, and formed by extrusion is fixed onto the shelter by bracket 108. Pipes 110 lead from each individual thermal transfer arrangement 104 to the tank 106 and are releasably connected to it by means of clamps (not shown). The expansion tank compensates for the variation in volume of the thermal transfer fluid. Apart from having a common expansion tank 106, the individual apparatuses 100 are entirely separate. In an alternative embodiment, each individual apparatus could have a separate expansion tank.

As can be seen from FIGS. 1 and 2, the control apparatus is incorporated into a closed, monolithic, box-shaped housing 200, a portion of the apparatus being inside the housing, and a portion being outside. The housing includes thermally insulated panels 202 which act as a shelter for electrical equipment 204. The panels are of a sandwich construction, the outer layers of the sandwich being aluminium or steel sheets, between which are sandwiched high density hot injected polyurethane foamed under pressure. They are held together by an aluminium or steel frame. The external part of the apparatus is retained on the housing by, amongst other means, brackets 206.

An individual control apparatus 100 is now described in more detail with reference to FIG. 3. The thermal transfer arrangement 104 includes a conduit 112 in the form of a closed circuit. An external portion of the conduit acts as an external heat exchange device 114 for exchanging heat with the external environment, and an internal portion of the conduit acts as an internal heat exchange device 116 for exchanging heat with the thermal storage device 102 and with the internal environment.

The external and internal heat exchange devices 114 and 116 are connected together via two curved, sealed pipes 118 forming part of the conduit. The pipes are covered with insulating material 120, part of this material being shown cut away in FIG. 3. The pipes are releasably connected to the heat exchange devices 114 and 116 by releasable couplings 122 made of reinforced rubber, each coupling being fastened to its respective pipe and heat exchange device by two or more clamps (not shown) which in the preferred embodiment are made of steel. The couplings 122 are again covered with insulating material 124, part of this material being shown cut away in FIG. 3.

The insulating material 124 is not of a particularly heavy grade, and hence is easily removable to expose the releasable couplings 122.

It will be apparent that the heat exchange devices 114 and 116 are easily and repeatably removable from the remainder of the control apparatus 100. This is achieved by loosening the various clamps and couplings, and removing the pipes 118. The external heat exchange device 114 can then be removed very easily. The internal heat exchange device 116 is configured to be easily removable by being slid lengthways to its farthest extent. Its distal end is then released from its aperture in the panel 202. The heat exchange device can then be removed by a combination of a pivotal and a sliding movement.

In the apparatus of the present invention, since the thermal transfer fluid is essentially at atmospheric pressure, the couplings 122 do not reed to be able to withstand any substantial pressure. Nevertheless, to prevent any possible leakage of the thermal transfer fluid damaging the equipment 204 within the housing 200, any necessary releasable coupling is located outside the housing. There are no releasable couplings within the housing.

An inlet/outlet valve 126 is provided on the apparatus 100 for the filling and emptying of the thermal transfer fluid in the circuit during installation, repair or replacement of the apparatus.

With the heat exchange devices of the apparatus of the present invention, no evaporator or condenser units are required, and hence the apparatus operates in a relatively simple fashion. The thermal transfer fluid does not change phase during normal operation of the apparatus, and is maintained substantially at ambient pressure by means of the expansion tank 106, which is open to the atmosphere.

An important feature of the hydraulic circuit, constituted by the conduit 112, in which the thermal transfer fluid flows is that it is in the form of a single, smooth, continuous, roughly oval-shaped loop. As viewed from within the loop, all the components of the loop (the heat exchange devices 114 and 116 and the sealed pipes 118) are either straight or concave; there is no reverse curvature anywhere on the loop. This can ensure a satisfactory flow of thermal transfer fluid in the hydraulic circuit. A further feature which can ensure satisfactory flow is that the conduit 112 is of relatively large internal diameter, to minimize hydraulic losses. In order to ensure the uni-directionallty of the flow, the heat exchange devices 114 and 116 are very slightly inclined with respect to the horizonal. The expansion tank 106 is suitably located near the uppermost point of the hydraulic circuit.

The thermal storage device 102 is now described in more detail with reference in particular to FIGS. 3 to 6. The device comprises a container in the form of a circular cross-section sleeve 128 which extends the length of the internal heat exchange device 116 so as to shroud it concentrically, and which is sealed thereto at each of its ends. The interior annular space in the sleeve is filled with thermal storage medium (not shown), so that the medium is in direct contact with the conduit. Hence thermal transfer can occur by conduction between the thermal transfer fluid and the medium.

The thermal storage medium is of a type which changes phase from solid to liquid at a selected temperature of interest. It thus acts as an efficient thermal "capacitor" of high enthalpy. For use in the desert, for example, the selected temperature might be in the range 35 to 50° C. The medium might typically be a stable, organic phase change compound. It would suitably be a compound derived from a lubricating oil fraction and containing large amounts of long-chain alkanes. Such a material has an almost indefinite life and is non-corrosive.

The thermal storage device 102 for each individual control apparatus 100 consists of a single container. This can afford a versatile arrangement in which the individual apparatus is easily removable or replaceable. Use of a single container also means that the thermal transfer fluid is not required to traverse any tortuous route through the thermal storage medium.

As shown in the various figures, a helicoidal fin 130 is provided on the external surface of the conduit 112 as part of the external heat exchange device 114, and extending along the length of this device 114. The fin assists heat transfer with the external environment. A similar helicoidal fin 132 is provided on the external surface of the sleeve 128, to assist heat transfer with the internal environment.

To assist heat exchange between the thermal storage device 102 and the thermal transfer arrangement 104, there is provided in the space between the sleeve 128 and the conduit 112 a set of helicoidal fins 134 which are in contact with the conduit 112 and extend out through the thermal storage medium to the wall of the sleeve 128. The fins 134 are wound tightly onto the conduit 112 so as to be in close frictional contact therewith; equally, the sleeve 128 is a tight fit over the fins. Usually just a single strip of metal is employed to make up the set of fins 134, but more than one strip may alternatively be employed.

It has been found pursuant to the present invention that the geometry and configuration of the fins 134 is important for the correct functioning of the apparatus of the present invention. In the first instance, it Is important that the fins are in contact both with the conduit 112 and the sleeve 128. This can achieve optimum, homogeneous heat transfer, and can also ensure that the thermal transfer fluid can exchange heat via a relatively direct route with the atmosphere inside the housing 200 as well as with the thermal storage medium.

Preferably the fin or fins are aligned neither with the longitudinal axis of the conduit 112 nor with its transverse axis, so that heat can be transferred both circumferentially around the thermal storage medium and also along it.

The total number of turns of the helicoidal fins, for all the fins combined, is preferably not more than 10%, but greater than 3 or 5%, of the length of the thermal storage device 102 in millimetres. The pitch between adjacent turns is preferably between 2 and 20%, more preferably between 4 and 15% of the diameter of the conduit 112. For a standard size of apparatus, with the diameter of the conduit 112 being between 8 and 20 cm, preferably between 10 and 15 cm, the pitch would suitably be in the region of 5 to 20 mm. Amongst other factors, the characteristics of the phase change material have been found to influence the optimum pitch. Again, the thickness of the individual fins is preferably greater than 0.25%, but less than 0.5%, of the diameter of the sleeve 128. For a standard size of apparatus, the fins might suitably have a thickness of about 1 mm. The above dimensional ranges have been found to afford the optimum thermal characteristics for the apparatus.

Further fins 136 and 138, which are star-shaped in cross-section, respectively extend lengthwise the length of the external and internal heat exchange devices 114 and 116 and are mounted in the interior of the conduit 112 in these regions. The conduit is circular in cross-section and of uniform diameter in these regions. These features can assure the maximum hydraulic and mechanical continuity between the external and internal parts of the thermal transfer arrangement 104.

The overall principles governing the operation of passive cooling apparatus have been described in relation to the known passive cooling apparatus. These principles also apply to the present invention.

The temperature control apparatus as described above possesses many beneficial characteristics, such as operation without primary power sources, an absence of moving mechanical or electrical parts, the fact that no part of the apparatus is under a pressure higher than that of atmospheric or of the column of static thermal transfer fluid, and the fact that the thermal transfer arrangement is in direct contact with the thermal storage medium and therefore the heat exchange is made by conduction and not convection or irradiation, hence leading to an improved thermal exchange efficiency. Also, the organic substance used as the thermal storage medium is stable and has an unlimited life; it is chosen and blended so as to help prevent an increase above the critical maximum internal temperature limits allowed inside the housing when the thermal transfer with the external environment is not activated due to the external ambient conditions. This thermal storage medium substantially reduces the difference between the internal maximum temperature during the day and the minimum at night, thereby increasing the Mean Time Between Failure factor and avoiding thermal and consequential mechanical stress that would result in a shorter life of the equipment inside the housing.

It will be understood that the present invention has been described above purely by way of example, and modifications of detail can be made within the scope of the invention. For example, the housing 200 could be provided with, say, three instead of four individual control apparatuses, but with room being left for a fourth such apparatus to be fitted at a later time if required It will also be understood that the number of individual control apparatuses depends mainly on the thermal performance necessary for internal temperature control of the housing and also on the housing location itself. Any number up to, say, six (or even higher) might be appropriate according to the thermal design.

Each feature disclosed in the description, and (where appropriate) the claims and drawings may be provided independently or in any appropriate combination.

What is claimed is:

1. A housing having a base, side walls and a roof and incorporating one or more apparatus for controlling temperature within the housing, each said one or more apparatus comprising:
    a thermal storage device for maintaining a controlled temperature within said housing, and
    a thermal transfer arrangement for selectively transferring heat between the thermal storage device and the external environment, according to the relative temperatures of the thermal storage device and the external environment, so as to effect thermal storage in the thermal storage device, said thermal transfer arrangement comprising:
        a first heat exchange device within said housing for exchanging heat with said thermal storage device,
        a second heat exchange device, external to the housing, for exchanging heat with the external environment, and
        a conduit, in the form of a continuous closed loop, for transporting a thermal transfer fluid between said first and second heat exchange devices;
        a support assembly disposed on the roof of said housing for supporting said conduit and said second heat exchange device, wherein:
    a removable part of the conduit, which forms the first heat exchange device, extends through apertures passing through side walls of the housing and also has distal portions extending outside the housing so that any leakage of the thermal transfer fluid occurs outside the housing;
    the distal portions extend beyond the side walls by an extent selected such that the first heat exchange device is supported by the side walls but can also be removed by sliding it lengthways to release one of said distal ends, inside the housing, from its side wall aperture, and
    releasable couplings are provided for the distal portions of the conduit both so as to facilitate (a) removal of said first heat exchange device, and (b) connection to the second heat exchange device, which is formed by another part of the conduit external of the housing.

2. The housing according to claim 1, further comprising one of an expansion tank connected to said at least one apparatus, and a thermal fluid expansion tank connected to each said at least one apparatus.

3. The housing according to claim 1, wherein the thermal transfer arrangement includes only one heat exchange device external to the housing.

4. The housing according to claim 1, further comprising an inlet/outlet valve provided on the thermal transfer arrangement, said valve being external to the housing.

5. The housing according to claim 1, wherein the thermal transfer arrangement is adapted to cool down the thermal storage device.

6. The housing according to claim 1 wherein said thermal transfer fluid does not change phase during normal operation of said one or more apparatus.

7. The housing according to claim 1, wherein the releasable couplings are made of a resilient material.

8. The housing according to claim 7, wherein the releasable couplings are joined to U-shaped parts of the conduit which communicate between the first and second heat exchange devices.

9. The housing according to claim 8, wherein the part of the conduit which forms the second heat exchange device is supported by brackets on the housing, and the first and second heat exchange devices are self-supported respectively by said housing side walls and said brackets when the releasable couplings are removed.

10. The housing according to claim 1, wherein the thermal storage device comprises a sleeve enclosing a portion of the conduit and containing a thermal storage medium, and at least one fin extends between the sleeve and the conduit through the medium, and wherein each said at least one fin is aligned neither with the longitudinal nor with the transverse axis of the portion of the conduit.

11. The housing according to claim 10, wherein the sleeve includes at least one outwardly projecting fin for exchanging heat with the interior of the housing.

12. The housing according to claim 1 wherein the conduit contains at least one fin.

13. The housing according to claim 1, further comprising a plurality of first heat exchange devices and respective thermal storage devices, and wherein said plurality of first heat exchange devices are releasably connected to respective second heat exchange devices which are external to the housing.

* * * * *